US012803579B2

(12) United States Patent
Miki

(10) Patent No.: US 12,803,579 B2
(45) Date of Patent: Nov. 17, 2026

(54) METHOD AND APPARATUS FOR STOCHASTIC ANALOG TO DIGITAL CONVERSION

(71) Applicant: Takashi Miki, Hamamatsu (JP)

(72) Inventor: Takashi Miki, Hamamatsu (JP)

(73) Assignee: Takashi Miki, Hamamatsu (JP)

( * ) Notice: Subject to any disclaimer, the term of this patent is extended or adjusted under 35 U.S.C. 154(b) by 56 days.

(21) Appl. No.: 18/853,819

(22) PCT Filed: Sep. 11, 2023

(86) PCT No.: PCT/JP2023/033638
§ 371 (c)(1),
(2) Date: Oct. 3, 2024

(87) PCT Pub. No.: WO2024/142507
PCT Pub. Date: Jul. 4, 2024

(65) Prior Publication Data

US 2025/0226837 A1 Jul. 10, 2025

Related U.S. Application Data

(60) Provisional application No. 63/436,101, filed on Dec. 29, 2022.

(51) Int. Cl.
*H03M 3/00* (2006.01)

(52) U.S. Cl.
CPC ........... *H03M 3/358* (2013.01); *H03M 3/412* (2013.01)

(58) Field of Classification Search
CPC ........ H03M 3/454; H03M 3/414; H03M 3/42; H03M 1/34; H03M 3/37; H03M 3/424;
(Continued)

(56) References Cited

U.S. PATENT DOCUMENTS 5,150,120 A * 9/1992 Yunus ..................... H03M 3/47 341/143
6,362,762 B1 * 3/2002 Jensen .................. H03M 3/396 341/143
(Continued)

FOREIGN PATENT DOCUMENTS

JP 2012531835 A 12/2012

OTHER PUBLICATIONS

International Search Report in PCT/JP2023/0033638 mailed Jan. 8, 2024, 2 pages.
(Continued)

*Primary Examiner* — Linh V Nguyen
(74) *Attorney, Agent, or Firm* — Keating & Bennett, LLP

(57) ABSTRACT

An analog to digital converter has an input, a plurality of quantizers, a plurality of feedback loops, and a plurality of filters. The input is configured to receive an input signal. The plurality of quantizers has the Nth quantizer, and the Nth quantizer has the Nth quantizer input and the Nth quantizer output. The Nth quantizer input is connected to the input. The plurality of feedback loops has the Nth feedback loop, and the Nth feedback loop is formed around the Nth quantizer output and the Nth quantizer input and configured to reduce the difference between the signal of the Nth quantizer output and an Nth reference signal at an Nth frequency region. The plurality of filters has an Nth filter. The Nth filter is configured to select the Nth frequency region. The feedback loops provide a way to control the effect of some nonidealities such as comparator offsets.

11 Claims, 6 Drawing Sheets

(58) Field of Classification Search
CPC ........ H03M 3/43; H03M 3/438; H03M 3/452; H03M 3/464; H03M 3/47; H03M 1/02; H03M 1/0626; H03M 1/066; H03M 1/0863; H03M 1/1004; H03M 1/12; H03M 1/1245; H03M 1/182; H03M 3/328; H03M 3/338; H03M 3/352; H03M 3/358; H03M 3/386; H03M 3/396; H03M 3/412; H03M 3/416; H03M 3/422; H03M 3/428; H03M 3/436; H03M 3/44; H03M 3/448; H03M 3/458; H03M 3/46; H03M 3/498
USPC .................................. 341/143, 159, 118–120
See application file for complete search history.

(56) References Cited

U.S. PATENT DOCUMENTS

| | | | | |
|---|---|---|---|---|
| 7,420,494 | B1 * | 9/2008 | Schreier | H03M 3/42<br>341/143 |
| 7,564,391 | B2 | 7/2009 | Das | |
| 8,072,363 | B2 * | 12/2011 | Yu | H03M 3/408<br>341/143 |
| 8,687,739 | B1 * | 4/2014 | Huynh | H03M 3/40<br>375/326 |
| 9,621,183 | B2 * | 4/2017 | Baringer | H03M 3/46 |
| 9,641,190 | B1 * | 5/2017 | Braswell | H03M 3/422 |
| 2009/0135038 | A1 * | 5/2009 | Das | H03M 3/42<br>341/143 |
| 2010/0219998 | A1 * | 9/2010 | Oliaei | H03M 3/37<br>341/143 |
| 2010/0328125 | A1 | 12/2010 | Pagnanelli | |
| 2011/0096878 | A1 | 4/2011 | Mattisson | |
| 2014/0203955 | A1 * | 7/2014 | Wang | H03M 1/34<br>341/143 |
| 2015/0091745 | A1 * | 4/2015 | Pagnanelli | H03M 3/468<br>341/143 |
| 2018/0343013 | A1 * | 11/2018 | Breems | H03M 3/496 |
| 2019/0165803 | A1 * | 5/2019 | Aboushady | H03M 3/43 |
| 2019/0238151 | A1 * | 8/2019 | Wang | H03M 3/32 |
| 2019/0379391 | A1 * | 12/2019 | Miglani | H03M 3/47 |
| 2022/0140835 | A1 | 5/2022 | Fredriksson et al. | |

OTHER PUBLICATIONS

Sundstrom et al., "Utilizing Process Variations for Reference Generation in a Flash ADC", IEEE Transactions on Circuits and Systems II: Express Briefs, vol. 56, issue 5, May 2009, 4 pages.
Ceballos et al., "Stochastic analog-to-digital conversion", 48th Midwest Symposium on Circuits and Systems, vol. 1, 2005, 4 pages.
Sun et al., "An Oversampling Stochastic ADC Using VCO-Based Quantizers", IEEE Transactions on Circuits and Systems I: Regular Papers, vol. 65, No. 12, Dec 2018, 4 pages.
Jeong et al., "A 4-MHz Bandwidth Continuous-Time Sigma-Delta Modulator With Stochastic Quantizer and Digital Accumulator", IEEE Transactions on Circuits and Systems II: Express Briefs, vol. 66, No. 7, Jul. 2019, 4 pages.
Miki, "Method and Apparatus for Stochastic Analog to Digital Conversion", U.S. Appl. No. 19/749,953, filed Jul. 22, 2026.
Official Communication issued in corresponding Japanese Patent Application No. 2025-561510, mailed on Jul. 21, 2026, 7 pages.

* cited by examiner

[Fig. 1]
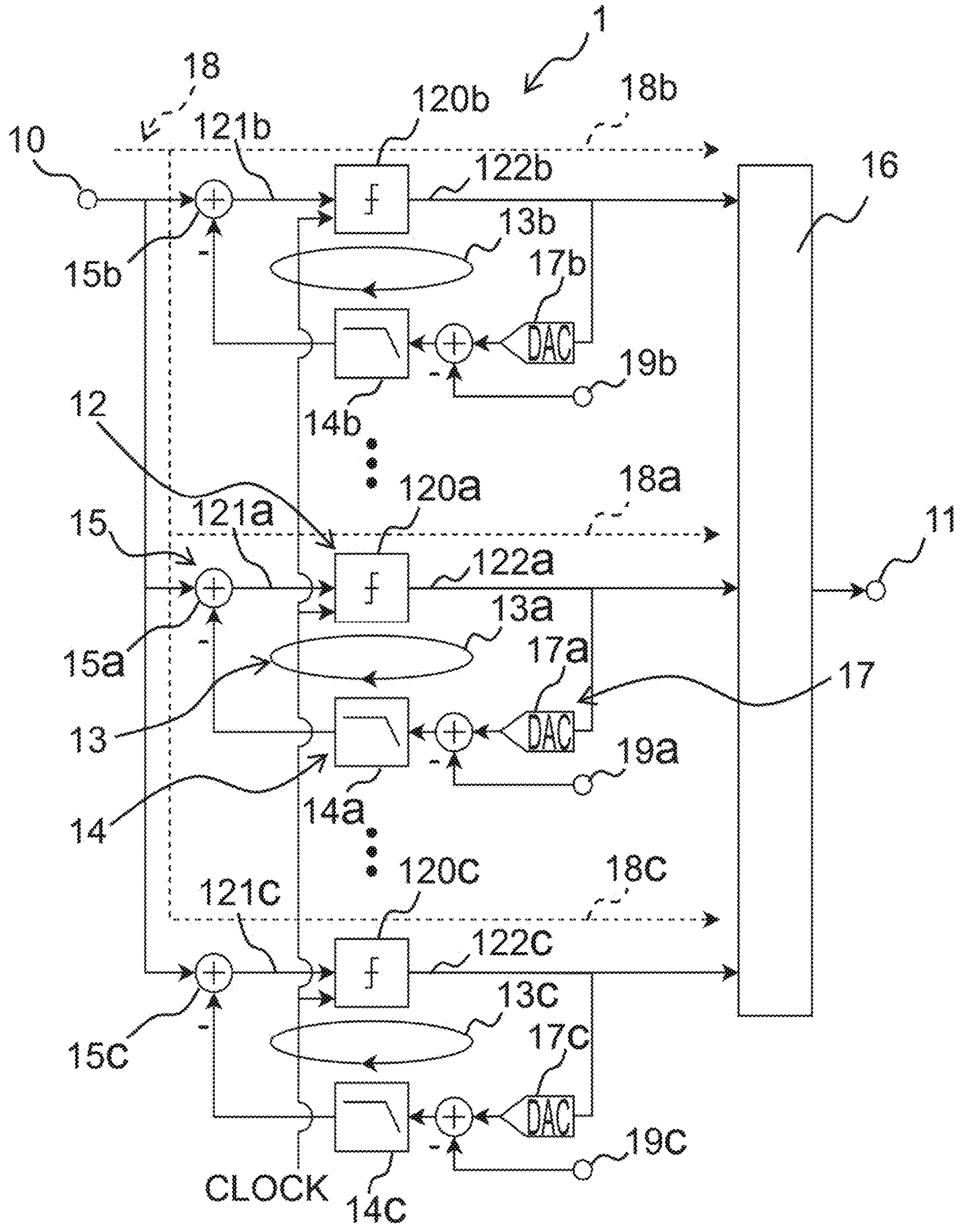

[Fig. 2]
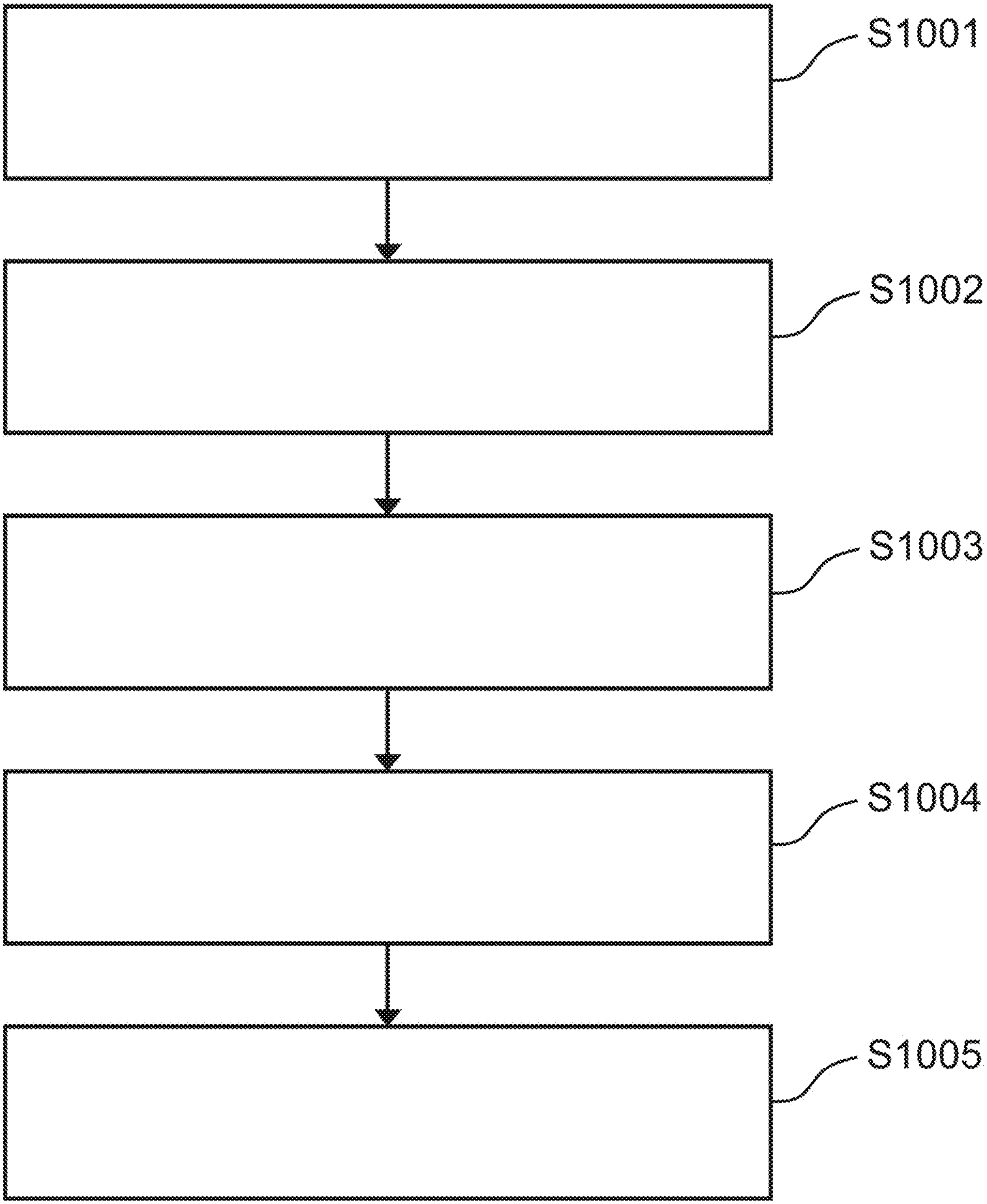

[Fig. 3]
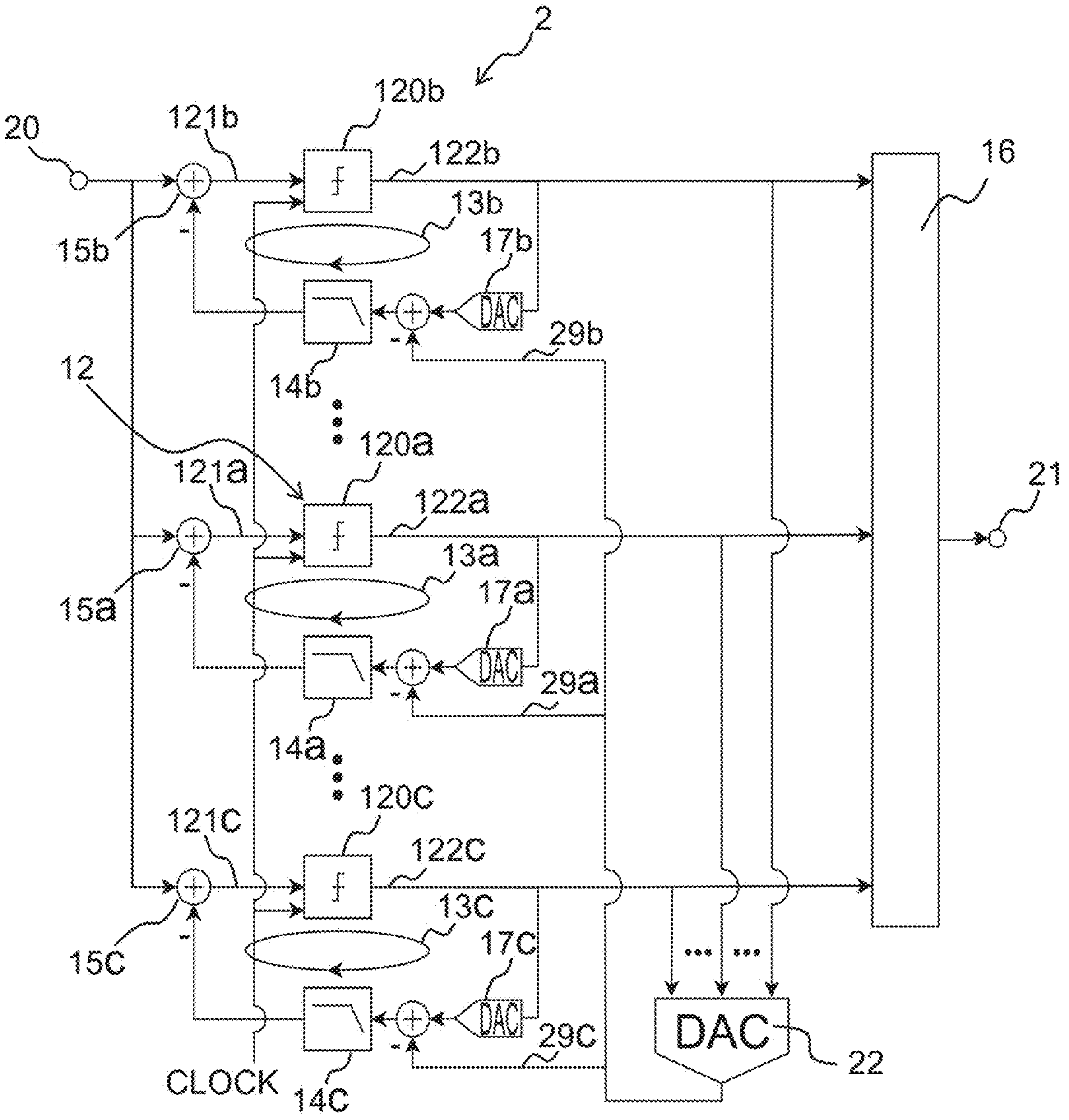

[Fig. 4]
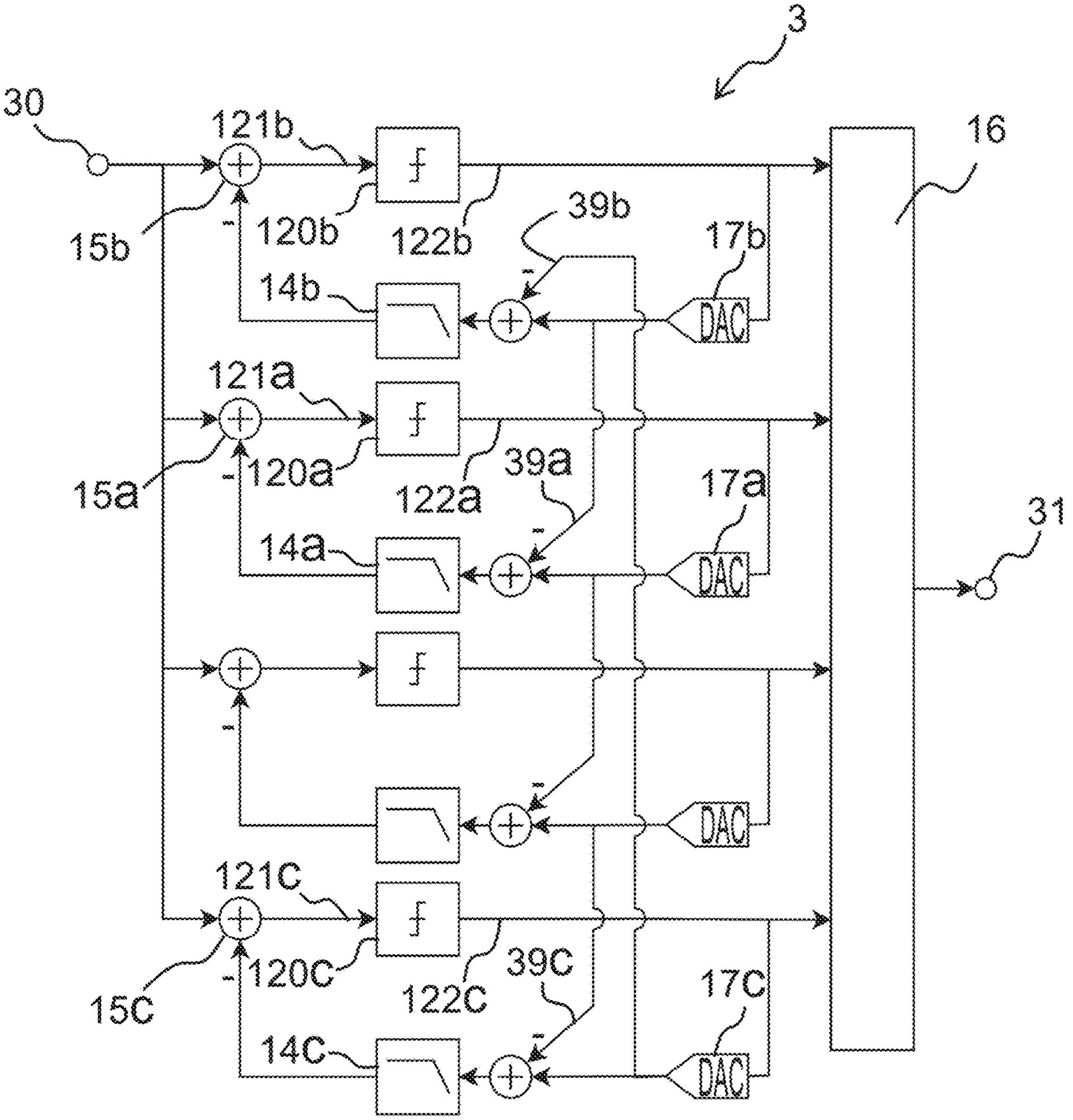

[Fig. 5]
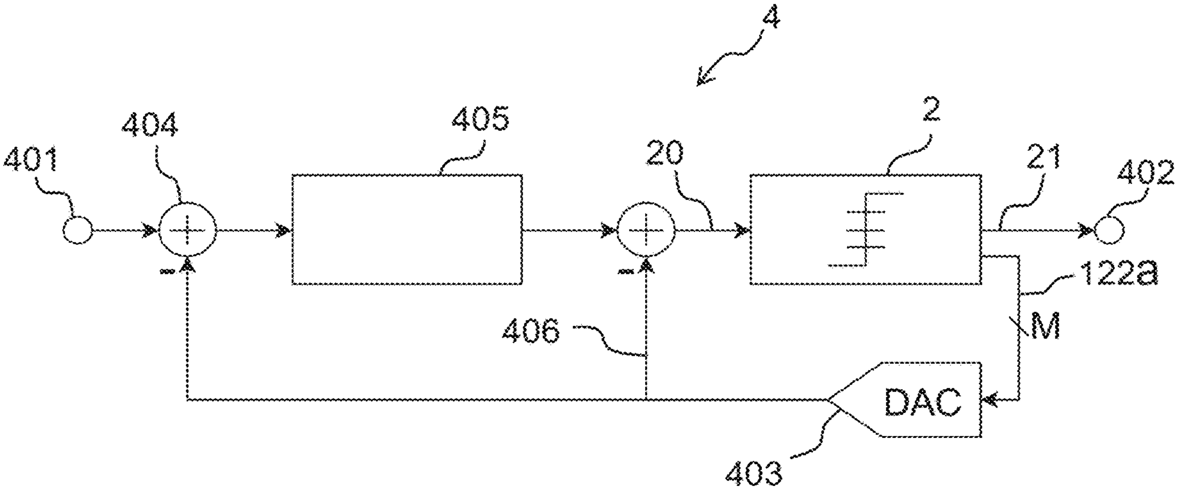
[Fig. 6]
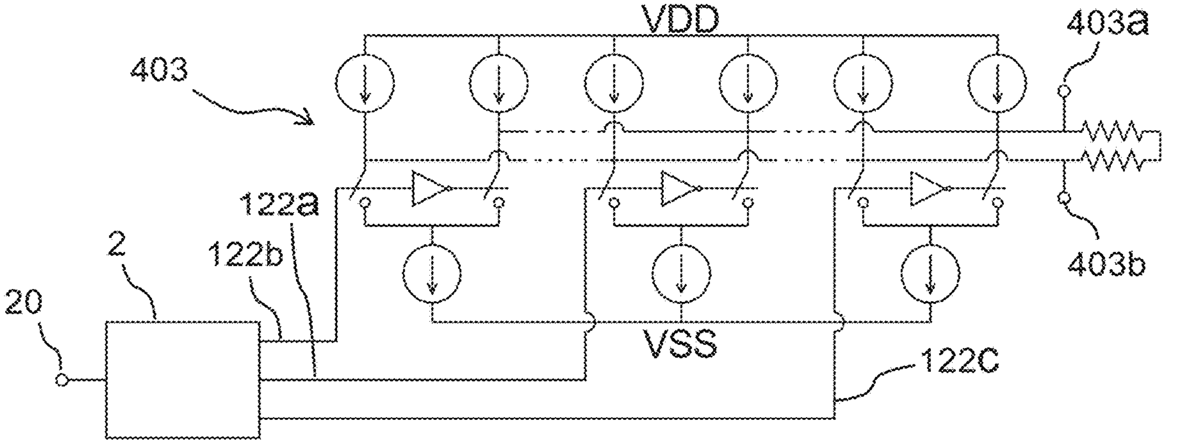

[Fig. 7]
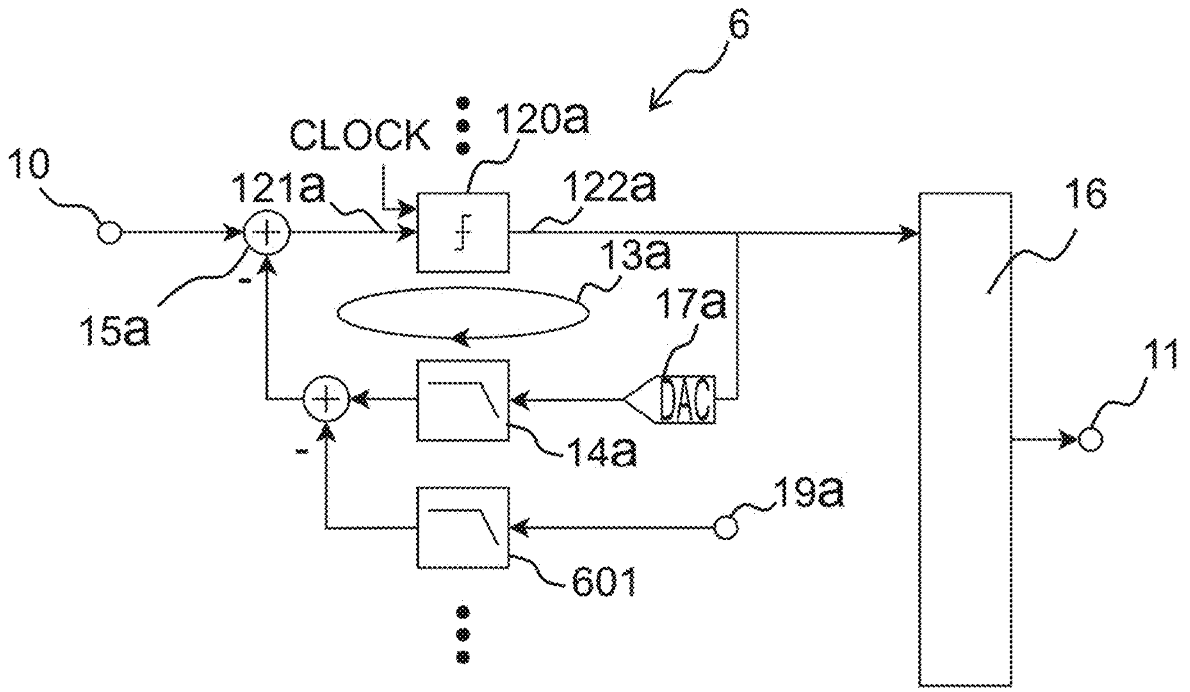
[Fig. 8]
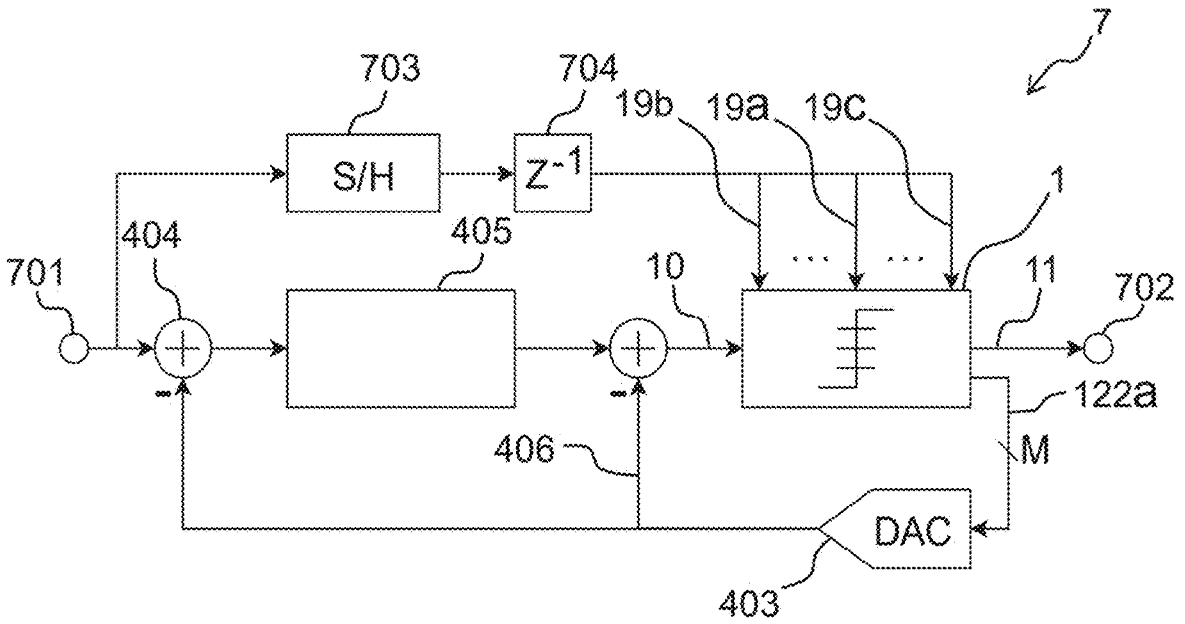

METHOD AND APPARATUS FOR STOCHASTIC ANALOG TO DIGITAL CONVERSION

TECHNICAL FIELD

This present invention relates generally electrical systems and electronic devices and, in particular, analog to digital signal converting systems and devices.

BACKGROUND ART

One type of stochastic analog-to-digital converter (ADC) uses the offsets of comparators, which work as single-bit quantizers, as references to realize multi-bit quantization. A stochastic ADC based on this comparator offset is demonstrated, for example, by T. Sundstrom and A. Alvandpour, "Utilizing Process Variations for Reference Generation in a Flash ADC," in IEEE Transactions on Circuits and Systems II: Express Briefs, vol. 56, no. 5, pp. 364-368, May 2009, doi: 10.1109/TCSII.2009.2019165. Using comparator offsets as the references allows to use smaller sizes of transistors for the comparator, and this is advantageous for increasing the speed and reducing the power consumption of the comparator. Meanwhile, the mismatch in the offset of comparators generally has the Gaussian distribution and therefore is determined only in a stochastic way. Since the references are not spaced linearly, this type of stochastic ADC often shows poor linearity. Furthermore, since the arrangement of the comparator offsets is determined in random, the performance in linearity largely degrades when an unfavorable set of comparator offsets is encountered. A similar type of stochastic ADC can be seen in U.S. Pat. Pub. No. US 2022/0140835 A1 (U.S. patent application Ser. No. 17/431,888), in which a structure with feedback is adopted to reduce the substantial signal swing at the input of the array of comparators. In U.S. Pat. No. 7,564,391 B2, an ADC intended to deal with large comparator offsets is disclosed, and it also uses feedback loops.

Another type of stochastic ADC is made by introducing dithering signals as the references of comparators as shown, for example, by J. L. Ceballos, I. Galton and G. C. Temes, "Stochastic analog-to-digital conversion," 48th Midwest Symposium on Circuits and Systems, 2005, 2005, pp. 855-858 Vol. 1, doi: 10.1109/MWSCAS.2005.1594236. Although its statistical characteristic is predefined, the dithering signals are not constant and determined only in a stochastic way. It is known that the linearity can be improved by using dithers as the references instead of comparator offsets as shown by H. Sun, K. Sobue, K. Hamashita and U. -K. Moon, "An Oversampling Stochastic ADC Using VCO-Based Quantizers," in IEEE Transactions on Circuits and Systems I: Regular Papers, vol. 65, no. 12, pp. 4037-4050 December 2018, doi: 10.1109/TCSI.2018.2836466. However, with this type of stochastic ADCs, comparator offsets have to be small enough not to interfere with the dithers. Because of this limitation, with the stochastic ADCs using dithers, it is difficult to obtain the benefit of comparators made of small transistors. Sigma delta ADCs which use a stochastic ADC with dither signals can also be found in U.S. Pat. No. 7,420,494 B1.

SUMMARY OF INVENTION

The ADC pertaining to the disclosed technology has an input, a plurality of quantizers, a plurality of feedback loops, and a plurality of filters. The input is configured to receive an input signal. The plurality of quantizers has the Nth quantizer, and the Nth quantizer has the Nth quantizer input and the Nth quantizer output. The Nth quantizer input is connected to the input. N is an integer larger than or equal to one and less than or equal to M, and M is an integer larger than or equal to two. The plurality of feedback loops has the Nth feedback loop, and the Nth feedback loop is formed around the Nth quantizer output and the Nth quantizer input and configured to reduce the difference between the signal of the Nth quantizer output and the Nth reference signal at the Nth frequency region. The plurality of filters has the Nth filter, and the Nth filter is arranged on the Nth feedback loop but not on any of paths carrying the input signal forward from the input to the Nth quantizer input. The Nth filter is configured to select the Nth frequency region.

Since the Nth feedback loop is configured to reduce the difference between the signal of the Nth quantizer output and the Nth reference signal at the Nth frequency region, the signal of the Nth quantizer output can be controlled by the Nth reference signal and the Nth feedback loop even when the signal of the Nth quantizer output is affected by some nonidealities such as comparator offsets.

BRIEF DESCRIPTION OF THE DRAWINGS

FIG. 1 is a diagram of ADC 1 pertaining to the first embodiment

FIG. 2 is a flowchart showing a method for analog to digital conversion with the first embodiment FIG. 3 is a diagram of ADC 2 pertaining to the second embodiment FIG. 4 is a diagram of ADC 3 pertaining to the third embodiment FIG. 5 is a diagram of sigma delta ADC 4 pertaining to the fourth embodiment FIG. 6 is a circuit diagram of global DAC 403 pertaining to the fourth embodiment FIG. 7 is a diagram of ADC 6 in accordance with an embodiment of the present technology FIG. 8 is a diagram of sigma delta ADC 7 in accordance with an embodiment of the present technology

DESCRIPTION OF EMBODIMENTS

The First Embodiment

ADC 1 (an example of an analog to digital converter) in FIG. 1 has input 10, output 11, a plurality of quantizers 12, a plurality of feedback loops 13, a plurality of filters 14, a plurality of summing portions 15, output stage 16, a plurality of digital-to-analog converters (DAC) 17, and a plurality of forward paths 18. The number of quantizers 12 is M, and M is an integer larger than or equal to two. N is an integer larger than or equal to one and less than or equal to M. Namely, 1≤N≤M and 2≤M.

Input 10 (an example of an input) is configured to receive an analog signal to be converted to a corresponding digital signal. The analog signal may be either continuous or discrete signals. For example, when there is an analog signal sampled and hold at a certain clock period, the sampled and hold signal is discrete but still is an analog signal. Output 11 is configured to be a terminal or terminals where the digital signal is output. The plurality of quantizers 12 (an example of a plurality of quantizers) includes the 1st to Mth quantizers. Namely, the 1st quantizer **120*b*, the Nth quantizer 120*a* (an example of an Nth quantizer), and the Mth quantizer 120*c* are all included in the plurality of quantizers 12**.

In this embodiment, each of the plurality of quantizers 12 is a single-bit quantizer. The Nth quantizer 120*a* has the Nth quantizer input 121*a* (an example of an Nth quantizer input) and the Nth quantizer output 122*a* (an example of an Nth quantizer output). The Nth quantizer input 121*a* is connected to input 10 via the summing portion 15*a*. The 1st quantizer 120*b* has the 1st quantizer input 121*b* and the 1st quantizer output 122*b*, and the Mth quantizer 120*c* has the Mth quantizer input 121*c* and the Mth quantizer output 122*c*, respectively. The plurality of quantizers 12 quantizes the signals of the quantizer inputs at every clock cycle determined by a clock signal. The output signals of the plurality of quantizers 12 are binary. At the Nth quantizer 120*a*, the signal of the Nth quantizer output 122*a* is the high value if the input signal at the Nth quantizer input 121*a* is larger than a certain threshold, meaning reference, and otherwise the output signal takes the low value. Other quantizers work in the same way. In this embodiment, the thresholds for the plurality of comparators 12 are nominally zero, but it is assumed that the thresholds are different from one another because of random offsets. The plurality of feedback loops 13 (an example of a plurality of feedback loops) includes the 1st feedback loop 13*b* to the Mth feedback loop 13*c*. The Nth feedback loop 13*a* (an example of an Nth feedback loop) is formed around the Nth quantizer output 122*a* and the Nth quantizer input 121*a* and configured to reduce the difference between the signal of the Nth quantizer output 122*a* and the Nth reference signal 19*a* (an example of an Nth reference signal) at low frequency region (an example of an Nth frequency region). The Nth feedback loop 13*a* in this embodiment includes the Nth quantizer 120*a*, the Nth DAC 17*a*, the Nth filter 14*a*, and the Nth summing portion 15*a*. All the 1st feedback loop 13*b* to the Mth feedback loop 13*c* are formed in substantially the same way as the Nth feedback 13*a*. The plurality of filters 14 (an example of a plurality of filters) includes the 1st filter 14*b* to the Mth filter 14*c*. The Nth filter 14*a* (an example of an Nth filter) is arranged on the Nth feedback loop 13*a* and put between the Nth quantizer output 122*a* and the Nth quantizer input 121*a*. The Nth filter 14*a* is not on any of the forward path 18*a* and other paths carrying the input signal forward from the input 10 to the Nth quantizer input 121*a*. The Nth filter 14*a* is configured to select the Nth frequency region. More specifically, the Nth filter 14*a* in this embodiment is a low-pass filter so that the feedback loop 13*a* works to reduce the difference between the single-bit output signal of the Nth quantizer output 122*a* and the Nth reference signal 19*a* at the low frequency region. The gain of the Nth filter 14*a* is high at low frequencies and low at other frequency region, which makes the low frequency region selected. The 1st filter 14*b* to the Mth filter 14*c* are also low pass filters in this embodiment and associated with the 1st feedback loop 13*b* to the Mth feedback loop 13*c*, respectively. They are arranged in substantially the same way as the Nth filter 14*a* with respect to the 1st reference signal 19*b* to the Mth reference signal 19*c*, respectively. The plurality of summing portions 15 (an example of a plurality of summing portions) includes the 1st summing portion 15*b* to the Mth summing portion 15*c*. The Nth summing portion 15*a* (an example of an Nth summing portion) is arranged on the Nth feedback loop 13*a* and configured to provide the Nth quantizer input 121*a* with the difference between the signal of input 10 (an example of an input signal and an analog signal) and the signal coming from the Nth filter 14*a*. At the Nth summing portion 15*a*, the signal from the Nth filter 14*a* is subtracted from the signal of input 10, and therefore the Nth feedback loop 13*a* closes at this point. A summing amplifier or a transconductance stage can be used to implement the Nth summing portion 15*a*. The Nth summing portion 15*a* may also be built as a part of a comparator as shown in U.S. Pat. No. 2022/0140835 A1. All the 1st summing portion 15*b* to the Mth summing portion 15*c* are arranged in substantially the same way as the Nth summing portion 15*a* with respect to the signals coming from the 1st filter 14*b* to the Mth filter 14*c*, respectively. Output stage 16 connects the 1st to Mth quantizer outputs and output 11 and configured to generate the output signal of ADC 1. More specifically, output stage 16 in this embodiment averages the signals of the 1st to Mth quantizer outputs to produce a signal as the output signal of the output 11. The signal of the 1st to Mth quantizer outputs are a single-bit signal in this embodiment, and averaging these signals are done in the digital domain. As a result, the output signal is obtained as a digital signal. The plurality of DACs 17 includes the 1st DAC 17*b* to the Mth DAC 17*c*. Each of the plurality of DACs 17 is a single-bit DAC and may be implemented using known topology such as a current steering DAC and resistive DAC.

The signal flow of ADC 1 can also be seen in FIG. 1. ADC 1 has the plurality of forward paths 18 that is configured to connect input 10 and output 11. The plurality of forward paths 18 includes the 1st forward path 18*b* to the Mth forward path 18*c*. The Nth quantizer 120*a* is on the Nth forward path 18*a* (an example of paths carrying the input signal forward from the input to the Nth quantizer input), the 1st quantizer 120*b* is on the 1st forward path 18*b*, the Mth quantizer 120*c* is on the Mth forward path 18*c*, and so forth. The plurality of quantizers 12 is connected to input 10 in parallel along the plurality of forward paths 18, and the signal of the input 10 is quantized by the plurality of quantizers 12 individually. The signal of the Nth quantizer output 122*a* is converted to an analog signal by the Nth DAC 17*a*, and then the Nth reference signal 19*a* is subtracted from the output signal of the Nth DAC 17*a*. The difference signal between the signal of the Nth quantizer output 122*a* and the Nth reference signal 19*a* is filtered by the filter 14*a* and processed by the Nth quantizer 120*a* again. This signal flow around the Nth quantizer output 122*a* and the Nth quantizer input 121*a* makes up the Nth feedback loop 13*a* working so that the difference between the signal of the Nth quantizer output 122*a* and the Nth reference signal 19*a* is reduced at the frequency region determined by the Nth filter 14*a*. The Nth filter 14*a* is not on the Nth forward path 18*a* in this embodiment. The loop gain of the Nth feedback loop 13*a* is provided by the Nth quantizer 120*a* and/or the filter 14*a*.

Since each of the plurality of quantizers 12 is a single-bit quantizer in this embodiment, the plurality of quantizers 12 can be realized by comparators. Transistors are usually used to build comparators, and semiconductor technology nowadays is used to implement transistors and other electronic components. The threshold voltage of a comparator has generally a random offset or displacement from the target value because of process variations due to the limitation of the precision of semiconductor fabrication process. Because of this offset, results of quantization can be different from quantizer to quantizer even if exactly the same input signal is input to an array of quantizers. In ADC 1, the effect of the offset to the quantization at the Nth quantizer 120*a* is controlled by the feedback loop 13*a*.

FIG. 2 shows the flowchart of the method for converting an analog signal to a digital signal using the technology disclosed herein. In step S1001, input 10 receives an analog signal. In step S1002, the plurality of quantizers 12 carries out quantization. In step S1003, the difference between the signal of the Nth quantizer output 122*a* and the Nth reference signal 19a is reduced at the Nth frequency region using the Nth feedback loop 13a formed around the Nth quantizer output 122a and the Nth quantizer input 121a. In step S1004, the Nth frequency region is selected using the Nth filter 14a that is arranged on the Nth feedback loop 13a and put between the Nth quantizer output 122a and the Nth quantizer input 121a. It should be noted that S1003 and S1004 are normally done in one process because the Nth filter 14a is on the Nth feedback loop 13a. In step S1005, the difference between the signal of input 10, meaning the analog signal to be converted, and the signal coming from the Nth filter 14a is provided for the Nth quantizer input 121a via the Nth summing portion 15a arranged on the Nth feedback loop 13a. The Nth quantizer 120a carries out quantization to the signal provided via the Nth summing portion 15a in step S1001.

The Second Embodiment

ADC 2 (an example an analog to digital converter) pertaining to the second embodiment is shown in FIG. 3. ADC 2 has input 20 (an example an input), output 21, and common components to ADC 1, and these common components are denoted with the same reference numbers as in ADC 1. Only the different part from ADC 1 is explained in detail. ADC 2 has DAC 22 (an example of a signal converter) configured to convert the signals of the 1st to Mth quantizer outputs to an analog signal (an example of a converted signal). The signals of the 1st to Mth quantizer outputs are averaged while they are converted to an analog signal by DAC 22. More specifically, the signals of the 1st quantizer output 122b to the Mth quantizer output 122c are summed and divided by M. This averaging process in this embodiment is carried out mostly in the analog domain, meaning after digital-to-analog conversion, but it may be done in the digital domain or by using both the digital and analog domains. The analog signal made by converting the signals of the 1st to Mth quantizer outputs is used as the Nth reference signal 29a and all the other reference signals. This means all the 1st reference signal 29b to the Mth reference signal 29c are the common converted analog signal.

As mentioned previously, the signals of the 1st to Mth quantizer outputs tend to differ from one another because of the mismatch in the offsets of the plurality of quantizers 12. The 1st to Mth feedback loops generate driving forces to reduce the difference between these signals of the 1st to Mth quantizer outputs. For example, the input offset of the comparator used as the Nth quantizer 120a is specific to the quantizer and always provides the same offset to the input signal at the Nth quantizer input 121a without the Nth feedback loop 13a. The Nth feedback loop 13a works so that the effect of the offset of the Nth quantizer 120a is equalized to the effects of the offsets of other quantizers at the Nth frequency region selected by the Nth filter 14a. Because of this action, the effect of the offset of the Nth quantizer 120a is distributed to other quantizers and scrambled so that the offset looks like a random pseudo-dithering signal.

The Third Embodiment

ADC 3 (an example an analog to digital converter) pertaining to the third embodiment is shown in FIG. 4. ADC 3 has input 30 (an example an input), output 31, and common components to ADC 1, and these common components are denoted with the same reference numbers as in ADC 1. Quantization is regulated by a clock signal as in previous embodiments though the clock signal is omitted in FIG. 4. ADC 3 represents the case where M is four. In ADC 3, the reference signals are the signal of one of the other quantizer outputs or its delayed version. More specifically, the Nth reference signal 39a is the signal of the 1st quantizer output 122b. Meanwhile, the 1st reference signal 39b is the signal of the Mth quantizer output 122c. Similarly, the Mth reference signal 39c is the signal of the neighboring quantizer output.

Since the signal of a quantizer output is used as the reference signal for another feedback loop in a cyclic way, the effects of the offsets of the plurality of quantizers 12 are driven to be distributed equally at the frequency regions selected by the filters 14. As a result, the effects of the offsets that are initially quantizer specific become scrambled so that they look like a random pseudo-dithering signal as in ADC 2.

The Fourth Embodiment

Sigma delta ADC 4 (an example of a sigma delta analog to digital converter) pertaining to the fourth embodiment is shown in FIG. 5. Sigma delta ADC 4 has ADC 2 pertaining to the second embodiment, global input 401, global output 402, global DAC 403, global summing portion 404, loop filter 405, and fast path 406. Global input 401 (an example of a global input) is configured to receive an analog signal to be converted to a corresponding digital output signal. Global output 402 is a terminal connected to output 21 of ADC 2 and configured to output the digital output signal. Global DAC 403 (an example of a global digital to analog converter) is configured to generate a feedback signal in response to the signals of the outputs of the plurality of quantizers 12. More specifically, the signals of the 1st quantizer output 122b to the Mth quantizer output 122c are converted to an analog signal and averaged by global DAC 403. Global DAC 403 may include a signal delay which accounts for part of the excess loop delay of sigma delta ADC 4. The excess loop delay includes the delays at the quantization process by the plurality of quantizers 12, at signal buffering, and at digital to analog conversion, and sometimes intentionally added delays as well. Fast path 406 is added to compensate the excess loop delay. Global summing portion 404 (an example of a global summing portion) is connected to global input 401 and configured to provide the difference between the signal of global input 401, meaning the global input signal, and the feedback signal generated by global DAC 403. Global summing portion 404 is realized, for example, as part of the first integrator in loop filter 405. Loop filter 405 is responsive to global summing portion 404 and connected between global summing portion 404 and input 20 of ADC 2. Loop filter 405 is used to define the signal band of signa delta ADC 4. Loop filter 405 is used to provide the loop gain of sigma delta ADC 4 as well, but it may be a passive loop filter instead. The topology of loop filter 405 is, for example, the cascade-of-integrators feedback/feedforward form, cascade-of-resonators feedback/feedforward form, or their mix.

A DAC with unary elements can be used to realize global DAC 403 as in FIG. 6. Global DAC 403 is a current steering DAC in this embodiment where M elements, that is current steering units, of the same size are arrayed and where the on and off states of the elements are controlled by the output signals of the plurality of quantizers 12. The signals of the 1st quantizer output 122b to the Mth quantizer output 122c are applied to the switches of the corresponding current steering units of global DAC 403 without being encoded or decoded. The current from the elements of global DAC 403 are collected at the resistors, and the output voltage is obtained as a differential signal at DAC outputs 403_a_ and 403_b_. The current of one element of global DAC 403 is generally different form one another because the current source forming each element is not completely the same due to the variations in the conditions such as process, bias voltages, and the temperature. Variations in the elements of the feedback DAC in a sigma delta modulator often degrade the DAC's performance in linearity. In ADC 2, the Nth feedback loop 13_a_ is formed around the Nth quantizer output 122_a_ and the Nth quantizer input 121_a_ and configured to reduce the difference between the signal of the Nth quantizer output 122_a_ and the Nth reference signal 29_a_ at the Nth frequency region selected by the Nth filter 14_a_. Furthermore, ADC 2 has DAC 22 configured to convert the signals of the 1st to Mth quantizer outputs to a converted signal, and the Nth reference signal 29_a_ is the converted signal. This configuration helps the signals of the 1st quantizer output 122_b_ to the Mth quantizer output 122_c_ become alike at the frequency regions, which is a low frequency region in this embodiment, selected by the plurality of filters 14. This means the elements of global DAC 403 are driven by similar input signals to each other at the low frequency region. As a result, the variations between the elements of DAC 403 are averaged according to the frequency characteristics of the Nth filter 14_a_ (1≤N≤M), and the degradation in linearity of sigma delta ADC 4 is mitigated. In other words, mismatch shaping is obtained with sigma delta ADC 4. The benefit of mismatch shaping of ADC 4 is obtained regardless of the kind of DAC 403, and other types of DAC such as a resistive DAC and capacitive DAC may be used for DAC 403.

ADC 2 which is used in sigma delta ADC4 has the Nth filter 14_a_. The Nth filter 14_a_ is not connected with loop filter 405 in series or in cascade. In other words, the Nth filter 14_a_ and loop filter 405 are not on a common forward path starting at global input 401 and ending at global output 402. More specifically, the Nth summing portion 15_a_ is arranged on the Nth feedback loop 13_a_ and configured to provide the difference between the signal of input 20 of ADC 2 and the signal coming from the Nth filter 14_a_ for the Nth quantizer input 121_a_. The Nth summing portion 15_a_ is on a forward path on which loop filter 405 is arranged while Nth filter 14_a_ is on the Nth feedback loop 13_a_ but before the Nth summing portion 15_a_, and therefore the Nth filter 14_a_ is not on the forward path of sigma delta ADC 4. When both the Nth filter 14_a_ and loop filter 405 are on the same forward path, the influence of the Nth filter 14_a_ to the noise transfer function of sigma delta ADC 4 becomes large, which in turn tends to degrade the stability of sigma delta ADC 4. With ADC 2, however, the degradation in stability is suppressed because the Nth filter 14_a_ is not arranged in cascade with loop filter 405.

Other Embodiments

The configuration of the invention herein is not limited to the embodiments described previously and can be changed as long as it serves the same purposes which are intended by the invention. The followings are some other possible variations and examples of embodiments.

The Nth filter 14_a_ is not limited to a low pass filter and it may be other types of filters such as a bandpass and lead-lag filters. Furthermore, the bands of the 1st filter 14_b_ to the Mth filter 14_c_ do not necessarily have to be the same, and they may be different from each other. For example, when the plurality of filters 14 is a low pass filter such as a single pole amplifier, the poles define the 1st to Mth frequency regions. In this case, the locations of the poles of the 1st to Mth filters may be the same, but they may be chosen so that they are different from one another as well. A replica of the Nth filter 14_a_ may be used for the Nth reference signal 19_a_ as in ADC 6 shown in FIG. 7. ADC 6 has filter 601 (an example of a unit configured to select the Nth frequency region for the Nth reference signal instead of the Nth filter) duplicating the Nth filter 14_a_, which makes it possible to move the summation point of signals to the output of the Nth filter 14_a_. Filter 601 does not have to exactly match the Nth filter 14_a_. For instances, filter 601 may have different poles and/or zeros from the Nth filter 14_a_. The Nth quantizer 120_a_ is not limited to a single-bit one, and multi-bit quantizers may also be used because mismatch shaping occurs between multi-bit quantizers as it does between single-bit quantizers when the technology disclosed herein is applied to a signa delta ADC with a plurality of multi-bit quantizers. It is not explicitly shown in the drawings, but the plurality of feedback loops 13 may include signal delays that accounts for the delays generated in the stages such as the quantization process by the plurality of quantizers 12, signal buffering, digital to analog conversion by the plurality of DACs 17 and so forth. In the previous embodiments, the offsets in comparators due to process variation are utilized to realize multi-bit analog to digital conversion, but the offsets may be added intentionally. The effects of those intentionally added offsets are equalized by the Nth feedback loop 13_a_ (1≤N≤M) in the same way as the native comparator offsets in the previous embodiments, and the intentionally added offsets can bring about dither like behavior. In ADC 2 of the second embodiment, the averaging at DAC 22 is done with uniform weights, but the averaging may be done with other types of weights such as uneven weights. Here the averaging is a concept including a mere summation. Signals in previous embodiments are not limited to voltage but also may be other types of signals such as current, pulse width, counts, phases and so on. Different signals from the previous embodiments are also allowed to be used as the Nth reference signal 19_a_. One example is shown in FIG. 8 as sigma delta ADC 7. Sigma delta ADC 7 has global input 701, global output 702, sample and hold circuit 703, delay 704, and ADC 1. The common components to sigma delta ADC 4 are denoted with the same reference numbers. The input signal of global input 701 is sampled and held by sample and hold circuit 703, delayed by one sampling clock period at the delay 704, and then used as the 1st reference signal 19_b_ to the Mth reference signal 19_c_.

INDUSTRIAL APPLICABILITY

The technology disclosed herein can be applied to analog to digital converters for which high speed sampling is required.

The invention claimed is:

1. An analog to digital converter comprising:

an input configured to receive an input signal;

a plurality of quantizers having an Nth quantizer, the Nth quantizer having an Nth quantizer input and an Nth quantizer output, the Nth quantizer configured to perform quantization based on the input signal, N being an integer larger than or equal to one and less than or equal to M, M being an integer larger than or equal to two;

a plurality of forward paths having an Nth forward path, the Nth forward path configured to carry the input signal forward from the input to the Nth quantizer input;

a plurality of feedback loops having an Nth feedback loop, the Nth feedback loop configured to:

combine the signal of the Nth quantizer output with the input signal to be processed by the Nth quantizer for quantization; and reduce the difference between the signal of the Nth quantizer output and an Nth reference signal at an Nth frequency region;

a plurality of filters having an Nth filter, the Nth filter arranged on the Nth feedback loop but not arranged on any paths carrying the input signal forward from the input to the Nth quantizer input, and the Nth filter configured to select the Nth frequency region; and a signal converter configured to convert the signals of the first to Mth quantizer outputs to a converted signal, the Nth reference signal being at least one of the converted signal and a delayed version of the converted signal, wherein the signals of the first to Mth quantizer outputs are averaged when they are converted by the signal converter.

2. The analog to digital converter according to claim 1, wherein the Nth filter is a low pass filter.

3. The analog to digital converter according to claim 1, wherein the Nth quantizer is a single-bit quantizer.

4. The analog to digital converter according to claim 1, further comprising a unit configured to select the Nth frequency region for the Nth reference signal instead of the Nth filter.

5. A sigma delta analog to digital converter comprising:

an analog to digital converter having:

(a) an input configured to receive an input signal, (b) a plurality of quantizers having an Nth quantizer, the Nth quantizer having an Nth quantizer input and an Nth quantizer output, the Nth quantizer configured to perform quantization based on the input signal, N being an integer larger than or equal to one and less than or equal to M, M being an integer larger than or equal to two, (c) a plurality of forward paths having an Nth forward path, the Nth forward path configured to carry the input signal forward from the input to the Nth quantizer input, (d) a plurality of feedback loops having an Nth feedback loop, the Nth feedback loop configured to;

combine the signal of the Nth quantizer output with the input signal to be processed by the Nth quantizer for quantization; and reduce the difference between the signal of the Nth quantizer output and an Nth reference signal at an Nth frequency region, and (e) a plurality of filters having an Nth filter, the Nth filter arranged on the Nth feedback loop but not arranged on any paths carrying the input signal forward from the input to the Nth quantizer input, and the Nth filter configured to select the Nth frequency region;

a global input configured to receive a global input signal;

a global digital to analog converter configured to generate a feedback signal in response to the signals of the first to Mth quantizer outputs;

a global summing portion configured to provide the difference between the global input signal and the feedback signal;

a loop filter responsive to the global summing portion and coupled between the global summing portion and the input of the analog to digital converter.

6. The sigma delta analog to digital converter according to claim 5, further comprising a signal converter configured to convert the signals of the first to Mth quantizer outputs to a converted signal, the Nth reference signal being at least one the converted signal and a delayed version of the converted signal.

7. The sigma delta analog to digital converter according to claim 5, further comprising a signal converter configured to convert the signals of the first to Mth quantizer outputs to a converted signal, the Nth reference signal being at least one of the converted signal and a delayed version of the converted signal, wherein the signals of the first to Mth quantizer outputs are averaged when they are converted by the signal converter.

8. The sigma delta analog to digital converter according to claim 5, wherein the Nth filter is a low pass filter.

9. The sigma delta analog to digital converter according to claim 5, wherein the Nth quantizer is a single-bit quantizer.

10. The sigma delta analog to digital converter according to claim 5, further comprising a unit configured to select the Nth frequency region for the Nth reference signal instead of the Nth filter.

11. A method for converting an analog signal to a digital signal, comprising:

receiving the analog signal with an input;

carrying out quantization with a plurality of quantizers having an Nth quantizer, the Nth quantizer having an Nth quantizer input and an Nth quantizer output, the Nth quantizer configured to perform quantization based on the analog signal, N being an integer larger than or equal to one and less than or equal to M, M being an integer larger than or equal to two;

providing the plurality of quantizers with the analog signal through a plurality of forward paths having an Nth forward path, the Nth forward path configured to carry the analog signal forward from the input to the Nth quantizer input;

reducing the difference between the signal of the Nth quantizer output and an Nth reference signal at an Nth frequency region using an Nth feedback loop configured to combine the signal of the Nth quantizer output with the analog signal to be processed by the Nth quantizer for quantization;

selecting the Nth frequency region using an Nth filter arranged on the Nth feedback loop but not arranged on any paths carrying the analog signal forward from the input to the Nth quantizer input; and producing the Nth reference signal using a signal converter configured to convert the signals of the first to Mth quantizer outputs to a converted signal, the Nth reference signal being at least one of the converted signal and a delayed version of the converted signal, wherein the signals of the first to Mth quantizer outputs are averaged when they are converted by the signal converter.

* * * * *